United States Patent
Joshi et al.

(10) Patent No.: US 6,724,225 B2
(45) Date of Patent: Apr. 20, 2004

(54) LOGIC CIRCUIT FOR TRUE AND COMPLEMENT SIGNAL GENERATOR

(75) Inventors: Rajiv V. Joshi, Yorktown Heights, NY (US); Ruchir Puri, New Rochelle, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/876,631

(22) Filed: Jun. 7, 2001

(65) Prior Publication Data

US 2002/0186050 A1 Dec. 12, 2002

(51) Int. Cl.[7] .............................................. H03K 19/00
(52) U.S. Cl. ........................ 326/113; 326/121; 326/119; 326/112; 326/98; 326/104; 326/108
(58) Field of Search .............................. 326/93–98, 104, 326/106, 108, 112, 114, 119, 121, 113

(56) References Cited

U.S. PATENT DOCUMENTS

| | | | | |
|---|---|---|---|---|
| 5,528,177 A | * | 6/1996 | Sridhar et al. ............... | 326/113 |
| 6,078,196 A | * | 6/2000 | Gayles ......................... | 326/121 |
| 6,292,027 B1 | * | 9/2001 | Dhong et al. ................. | 326/83 |
| 6,307,399 B1 | * | 10/2001 | Lien et al. ..................... | 326/83 |

* cited by examiner

Primary Examiner—Vibol Tan
(74) Attorney, Agent, or Firm—Dilworth & Barrese, LLP

(57) ABSTRACT

A MOSFET logic circuit for performing a logic AND operation is presented including three transistors, wherein at least two input signals are provided to the circuit and an output signal indicative of an AND operation performed on a first and second input signal of the at least two input signals is output from the circuit. In another embodiment, a MOSFET true and complement signal generating signal is presented including at least one MOSFET inverter logic circuit, and first and second MOSFET AND logic circuits, wherein each of the first and second AND logic circuits includes three transistors. The true and complement signal generating circuit receives first and second input signals and outputs a true signal and a complement signal indicative of the first input signal.

12 Claims, 5 Drawing Sheets

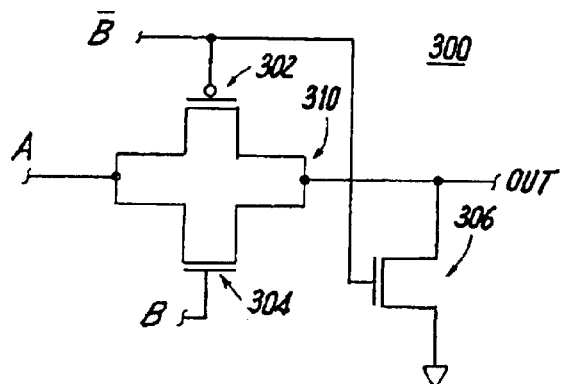
FIG. 3A
| A | B | B̄ | A·B |
|---|---|---|---|
| 0 | 0 | 1 | 0 |
| 1 | 0 | 1 | 0 |
| 0 | 1 | 0 | 0 |
| 1 | 1 | 0 | 1 |
FIG. 3B
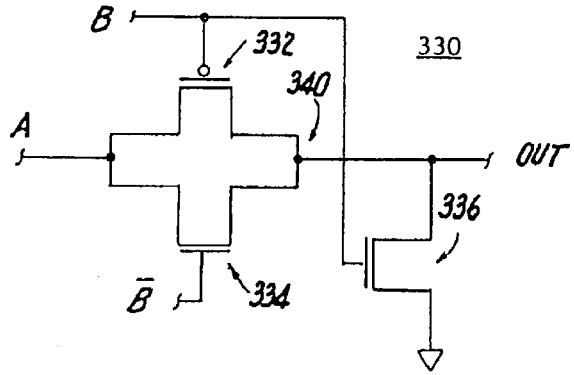
FIG. 3C
| A | B | B̄ | A·B̄ |
|---|---|---|---|
| 0 | 0 | 1 | 0 |
| 1 | 0 | 1 | 1 |
| 0 | 1 | 0 | 0 |
| 1 | 1 | 0 | 0 |
FIG. 3D

| Method | Delay (ps) | |
|---|---|---|
| | CLK-T | CLK-C |
| Prior Art | 52 | 51 |
| Present Invention | 23 | 31 |

FIG. 6

LOGIC CIRCUIT FOR TRUE AND COMPLEMENT SIGNAL GENERATOR

FIELD OF THE INVENTION

The invention relates to the field of integrated circuit (IC) design. Specifically, it relates to a circuit for a true and complement signal generator. More specifically, it relates to a circuit for a true and complement signal generator using an AND logic circuit using three MOSFET transistors.

BACKGROUND OF THE INVENTION

High performance arithmetic operations have been widely implemented using pass-transistor based circuits known for low power usage and high performance. One type of pass-transistor based circuit employs only NMOS transistors. However, NMOS transistors suffer from signal degradation due to a threshold voltage drop across the source and drain of the transistor when passing a HIGH signal.

In a CMOS silicon-on-insulator (SOI) implementation, threshold voltage drop is minimized and performance is maximized due to the absence of a reverse body effect. Not only is the SOI implementation of an NMOS transistor body rarely reverse-biased, it tends to be forward-biased with respect to the source. Fluctuating biasing conditions and switching patterns cause a fluctuation in the forward bias of the body-to-source junction of the NMOS transistor, causing large variations in hysteretic delay.

To overcome the drawbacks associated with NMOS only pass-transistor circuits of both bulk CMOS and SOI CMOS implementations, transmission gates using both NMOS and PMOS transistors are used. VLSI circuits formed of NAND, NOR and INVERTER basic building block circuits using transmission gates are implemented using static or dynamic CMOS. Static CMOS circuits are generally more widely used due to their superior rail-to-rail voltage swing, robust behavior and high noise immunity.

However, static CMOS circuits require one NMOS and one PMOS transistor for every input signal. Furthermore, static CMOS gates are inverting by nature. This results in a large count of transistors for each basic circuit, large delays and high power consumption, as will be described with reference to FIGS. 1A and 1B.

FIG. 1A shows a logic representation of a two input AND operation 10. The truth table for the two input AND operation 10 is shown in FIG. 3B. In static CMOS logic, the two input AND operation 10 is implemented using a two input NAND gate 12 and a first inverter gate 14. The output C of the NAND gate 12 is A NAND B. The first inverter gate 14 outputs NOT C which is equal to A AND B. FIG. 1B shows the static CMOS logic circuit 20 for the two input AND operation 10 implementing a conventional NAND circuit 21 and a conventional inverter circuit 23. The static CMOS logic circuit 20 requires six transistors including three NMOS transistors 22, 24, 26 and three PMOS transistors 28, 30, 32. A typical delay associated with circuit 20 is 41 ps.

The basic logic AND circuit 20 are used as building blocks in applications such as a prior art True and Complement Signal Generator. With reference to FIG. 2A, a typical prior art logic representation 200 of a True and Complement Signal Generator is shown. The inputs to the True and Complement Signal Generator are a CLK signal and signal A, and the outputs are a true signal T and a complement signal C. A NAND gate 12 and an inverter gate 14 are provided together to perform an AND operation for producing each of the output signals T and C. Additional inverter gates 114 are provided for buffering the input signals CLK and A. The logic equations for the T and C signals are as follows:

$$T = \sim A \cdot \sim CLK \quad (1)$$

$$C = A \cdot \sim CLK \quad (2)$$

With reference to FIG. 2B, a transistor representation of a typical prior art True And Complement Signal Generator circuit 220 is shown. A logic AND circuit 20, including a conventional NAND circuit 21 and a conventional inverter circuit 23, is provided for implementing each of the AND logic operations for producing the output signals T and C. Several conventional inverter circuits 23 are provided for implementing the inverting functions shown in FIG. 2A. The total number of transistors in the circuit 220 is 22 including 11 NMOS transistors and 11 PMOS transistors. The CLK signal input passes through a series of two inverter gate circuits 23 and one NAND gate circuit 21 for generating each of the T and C signals. The A signal input passes through a series of four inverter gate circuits 23 and one NAND gate circuit 21 for generating signal T, and a series of five inverter gate circuits 23 and one NAND gate circuit 21 for generating signal C. A delay is generated as the input signals pass through each of the inverter gate circuits 23 and the NAND gate circuits 21.

SUMMARY

An aspect of the present invention is to provide a basic logic circuits for the AND logic operation in which the number of transistors for the circuit is reduced for minimizing the size, power consumption and associated delays of the circuit, thereby maximizing efficiency.

It is another aspect of the present invention to provide a basic logic circuit for the AND logic operation in which the number of transistors that a signal passes through in series is minimized for minimizing associated delays.

Finally, it is an aspect of the present invention to provide a True And Complement Signal Generator circuit implementing the basic AND logic circuit having a reduced number of transistors and reduced associated delays for minimizing the size, power consumption and associated delays of the True And Complement Signal Generator circuit.

Accordingly, in one embodiment of the present invention, a MOSFET logic circuit having three transistors is presented for performing a logic AND operation, wherein at least two input signals are provided to the circuit and an output signal indicative of an AND operation performed on a first and second input signal of the at least two input signals is output form the circuit.

In another embodiment of the present invention, a MOSFET true and complement signal generating logic circuit is presented for receiving first and second input signals and outputting a true signal and a complement signal indicative of the first input signal to the true and complement signal generating logic circuit, the true and complement signal generator circuit including at least one MOSFET inverter logic circuit, and first and second AND logic circuits, wherein each of the first and second AND logic circuits includes three transistors.

BRIEF DESCRIPTION OF THE FIGURES

FIG. 3A shows a circuit for a logic AND function in accordance with the present invention;

FIG. 3B shows a truth table for the logic AND function in accordance with the present invention;

FIG. 3C shows a circuit for a logic AND function in accordance with the present invention.

FIG. 3D shows a truth table for the logic AND function in accordance with the present invention;

FIG. 6 is a table of measured delays comparing True and Complement Signal Generators of the prior art and in accordance with the present invention.

DETAILED DESCRIPTION OF THE INVENTION

Figure 1A:
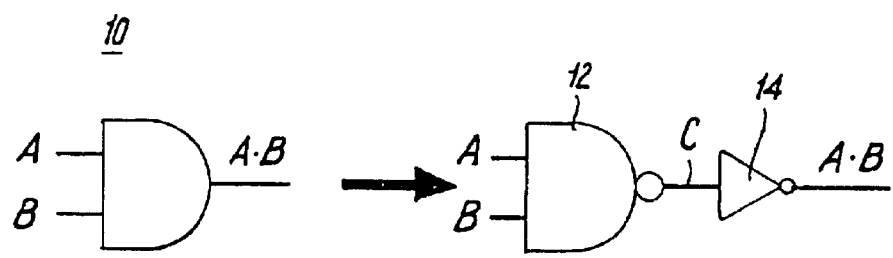
FIG. 1A is a prior art logic representation of a logic AND function.
Figure 1B:
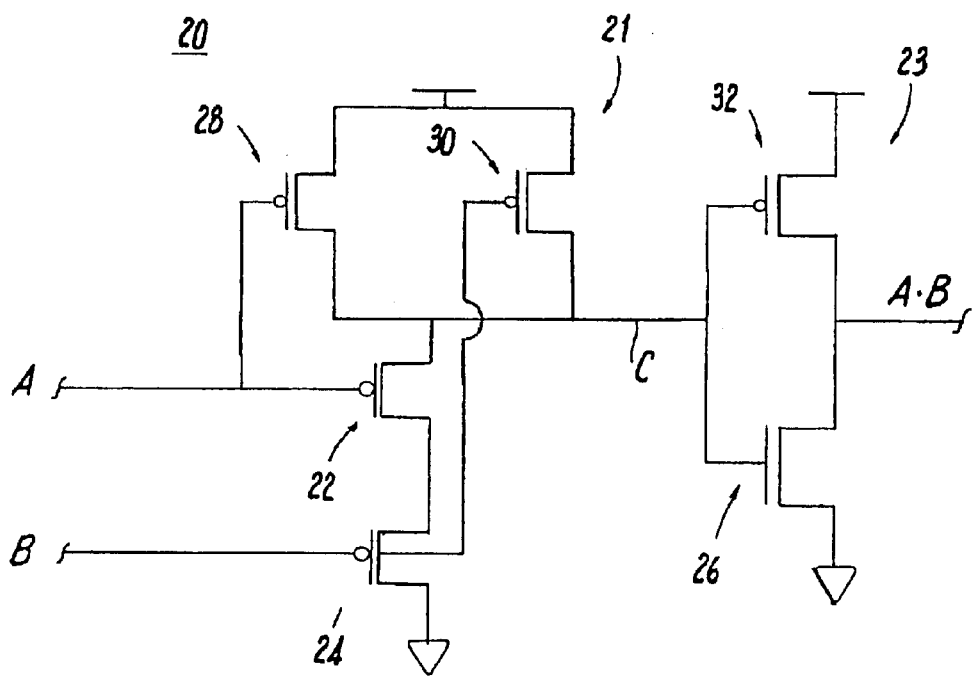
FIG. 1B shows a prior art circuit for implementing a logic AND function.
Figure 2A:
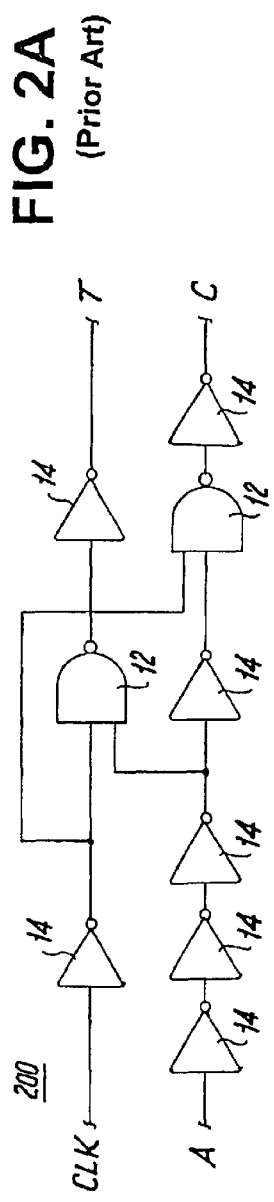
FIG. 2A is a prior art circuit for a True and Complement Signal generator.
Figure 2B:
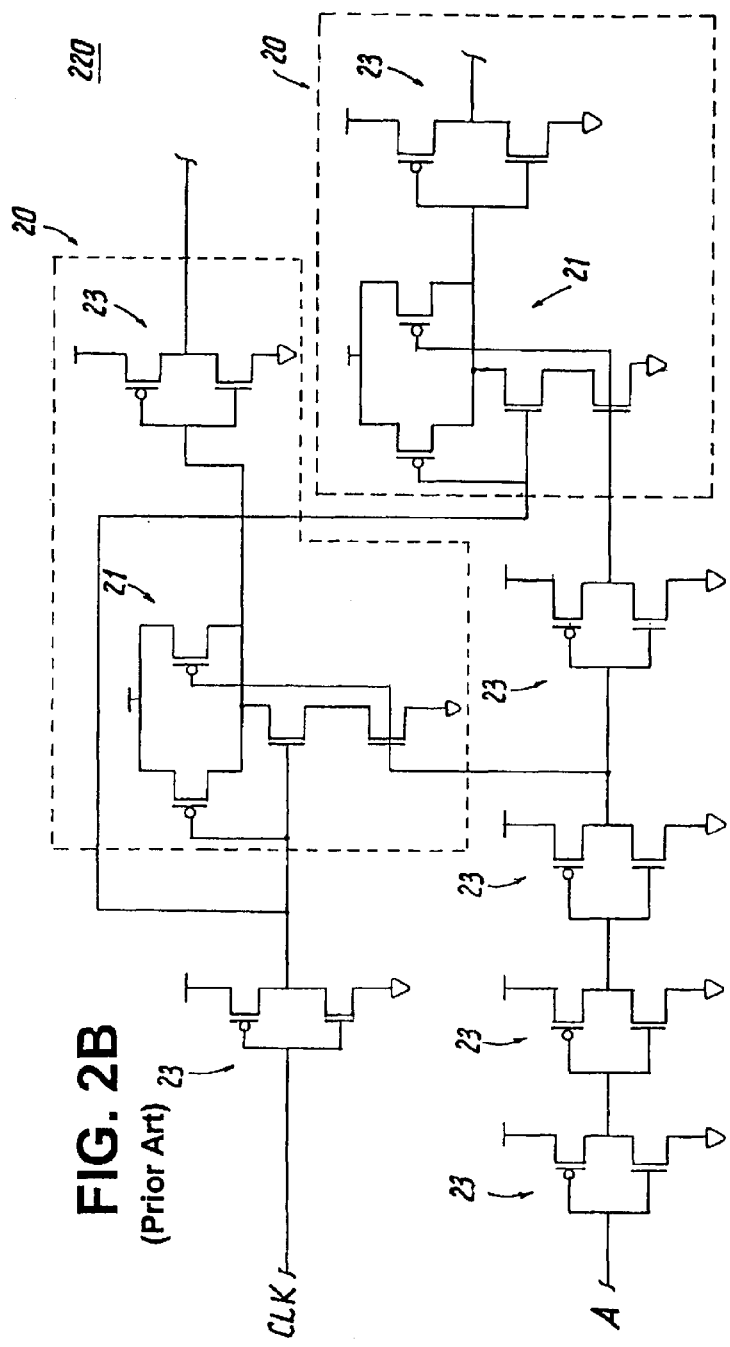
FIG. 2B shows a prior art circuit for a True and Complement Signal Generator.

The present invention provides a circuit for a logic AND operation. Three MOSFET transistors are used for the circuit. Hence, the number of components and the delay is reduced relative to the prior art.

It is to be appreciated by one skilled in the art, that reference to an input signal as being the same (or the like) as an output signal means approximately the same.

FIG. 3A shows a circuit 300 of a logic AND operation according to the present invention. The circuit 300, implementing the operation A AND B for input signals A, B and ~B, includes three transistors, including a PMOS transistor 302 and an NMOS transistor 304 and a pull-down NMOS transistor 306. A transmission gate 310 is formed at the junction of transistors 302, 304. Input A is provided to transistors 302, 304. Input B is provided to the gate of transistor 304 and input ~B is provided to the gate of transistor 302. The output of the transmission gate 310 is connected to the drain of pull-down transistor 306. Input ~B is provided to the gate of pull-down transistor 306. The output of the circuit is the OUT signal, which is equal to A B.

Circuit 300 operates such that when input B is HIGH the transmission gate 310 is closed and the output of the transmission gate 310 is the same as input A. The output of the transmission gate 310 is not pulled down by pull-down transistor 306, so the output of the circuit OUT is the same as the output of the transmission gate 310, i.e. HIGH when A is HIGH and LOW when A is LOW. The delay of circuit 300 when B is HIGH is approximately equal to the delay of the transmission gate 310.

When input B is LOW the transmission gate 310 is OPEN and the pull-down transistor 306 pulls the output of the transmission gate 310 to LOW, so that the output of the circuit OUT is LOW when A is HIGH and when A is LOW. The OUT signal has a voltage level approximately equal to a drain of pull-down transistor 306. The delay of the circuit when B is LOW is approximately equal to only the delay of the NMOS pull-down transistor 306. A typical delay associated with circuit 300 is 15 ps.

The truth table for the circuit 300 is shown in FIG. 3B, showing that circuit 300 implements the operation A AND B. Circuit 300 implements the AND operation with a reduced count of transistors and a reduced delay relative to the prior art.

FIG. 3C shows another embodiment, of a logic AND operation according to the present invention. Circuit 330, implementing the operation A AND ~B for input signals A, B and ~B, includes three transistors, including a PMOS transistor 332 and an NMOS transistor 334 and a pull-down NMOS transistor 336. A transmission gate 340 is formed at the junction of transistors 332, 334. Input A is provided to transistors 332, 334. Input ~B is provided to the gate of transistor 334 and input B is provided to the gate of transistor 332. The output of the transmission gate 340 is connected to the drain of pull-down transistor 336. Input B is provided to the gate of pull-down transistor 336. The output of the circuit is the OUT signal, which is equal to A·~B.

Circuit 330 operates such that when input B is LOW the transmission gate 340 is closed and the output of the transmission gate 340 is the same as input A. The output of the transmission gate 340 is not pulled down by pull-down transistor 336, so the output of the circuit OUT is the same as the output of the transmission gate 340, i.e. HIGH when A is HIGH and LOW when A is LOW. The delay of circuit 330 when B is LOW is approximately equal to the delay of the transmission gate 340.

When input B is HIGH the transmission gate 340 is OPEN and the pull-down transistor 336 pulls the output of the transmission gate 340 to LOW, so that the output of the circuit OUT is LOW when A is HIGH and when A is LOW. The OUT signal has a voltage level approximately equal to a drain of pull-down transistor 336. The delay of the circuit when B is HIGH is approximately equal to only the delay of the NMOS pull-down transistor 336.

The truth table for the circuit 330 is shown in FIG. 3D, showing that circuit 330 implements the operation A AND ~B. Circuit 330 implements the AND operation with a reduced count of transistors and a reduced delay relative to the prior art.

Figure 4:
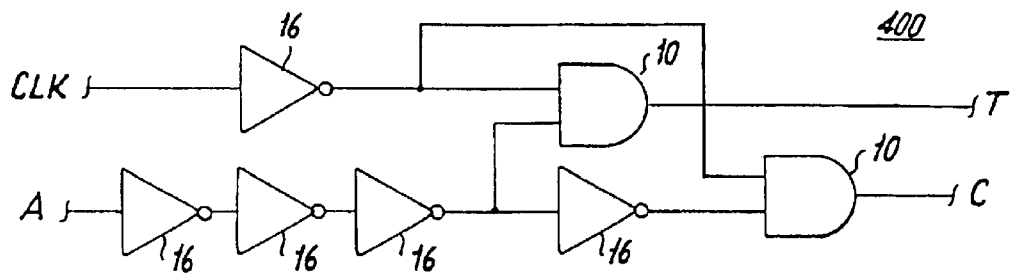
FIG. 4 shows a logic representation of a True and Complement Signal Generator in accordance with the present invention.
Figure 5:
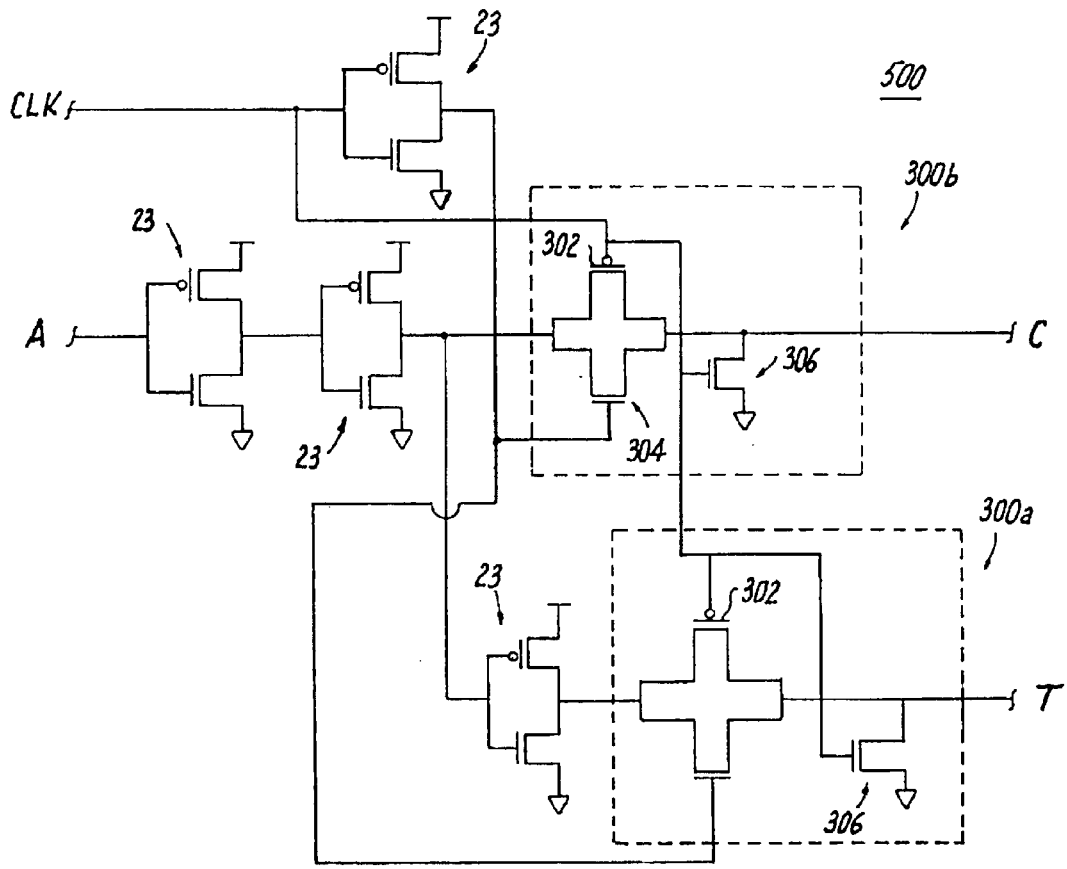
FIG. 5 shows a circuit for implementing a True and Complement Signal Generator in accordance with the present invention.

Referring to FIGS. 4 and 5, an implementation of a True and Complement Signal Generator is provided using the circuits described above according to the present invention. FIG. 4 shows a logic representation 400 of the True And Complement Signal Generator. The inputs to the True And Complement Signal Generator are a CLK signal and an A signal, and the outputs are a true signal T and a complement signal C. Two AND gates 10 are provided for producing the respective output signals T and C in accordance with the equations (1) T=~A·~CLK and (2) A·~CLK. Inverters gates 16 are provided for buffering the A and CLK signals, respectively, as well as for performing a logic invert operation for producing an inverted A signal, ~A.

With respect to FIG. 5, a transistor representation of a True And Complement Signal Generator circuit 500 is shown. Input signals A and CLK are provided to circuit 600, and a true signal T and a complementary signal C are output. Circuit 500 includes the two inventive logic AND circuits 300a, 300b described above for implementing each of the AND gates 10 needed to produce the respective T and C signals. The AND circuits 300a, 300b operate substantially similar within the True and Complementary Signal Generator as described above.

Five conventional inverter circuits 23 are provided for implementing the invert gates 16 and provide the buffering needed to produce the respective T and C signals.

The T signal is output from logic AND circuit 300a, in which input signal A passes through three inverter circuits 23 to produce signal ~A, which is provided as an input to transistors 302 and 304 of circuit 300a. The CLK signal is provided to the gate of transistor 302 and the gate of transistor 306. The CLK signal also passes through one inverter circuit 23 to produce a ~CLK signal which is provided to the gate of transistor 304. The output is the T signal fulfilling equation (1) T=~A·~CLK.

The C signal is output from the logic AND circuit 300b, in which input signal A passes through two inverter circuits 23 and is provided as an input to transistors 302 and 304 of circuit 300b. The CLK signal is provided to the gate of transistor 302 and the gate of transistor 306. The CLK signal also passes through one inverter circuit 23 to produce the ~CLK signal and is provided to the gate of transistor 304. The output is the C signal fulfilling equation (2) C=A·~CLK.

The total number of transistors in the circuit 500 is fourteen, including eight NMOS transistors and six PMOS transistors. All of the transistors are fabricated using MOSFET technology. The total number of transistors is reduced by over 36% and the number of PMOS transistors is reduced by 45% as compared to a prior art True And Complement Signal Generator. This results in reducing the size as well as the power consumption of the True and Complement Signal Generator of the present invention relative to the prior art.

The delay of the circuit 500 is reduced relative to the prior art by reducing the number of inverter circuits 23 each signal passes through, and by using the logic AND circuit 300 of the present invention instead of the NAND circuit 21 of the prior art. With continual reference to circuit 500 of FIG. 5, the A signal passes through a series of three inverter circuits 23 and one AND circuit 300a for generating signal T, and a series of two inverter circuits 23 and one AND circuit 300b for generating signal C.

Referring to FIG. 6, a table is presented illustrating measured delay improvements of the circuit 500 relative to a prior art circuit for a True And Complement Signal Generator. The measured delay is the time lapse from the generation of a CLK pulse to generation of each of the T and C signals. The measurements provided are for a True And Complement Signal Generator formed using 0.18 $\mu$gm SOI technology with a supply voltage of approximately 1.2 V and an operating temperature of approximately 10° C. The improvement in delay for the inventive circuit 600 is 55% for signal T and 39% for signal C.

What has been described herein is merely illustrative of the application of the principles of the present invention. Other arrangements and methods may be implemented by those skilled in the art without departing from the scope and spirit of the invention.

What is claimed is:

1. A MOSFET true and complement signal generating logic circuit receiving two input signals comprising a first and second input signal and outputting a true signal and a complement signal indicative of the first input signal to the true and complement signal generating logic circuit, comprising:

at least one inverter logic circuit; and first and second MOSFET AND logic circuits;

each of the first and second AND logic circuits including three transistors wherein the three transistors receive at least two AND input signals, and output a usable output signal indicative of an AND operation performed on a first and second AND input signal of the at least two AND input signals, wherein the at least two AND input signals to the first and second AND logic circuits include first and second AND input signals and a complement of the second AND input signal, the first AND input signal is provided to a source of first and second transistors of the three transistors, the second AND input signal is provided to a gate of the first transistor, and the complement of the second AND input signal is provided to a gate of the second transistor, wherein for the first AND logic circuit, the first AND input signal is the first input signal to the true and complement signal generating logic circuit after passing through first and second inverter logic circuits of the at least one inverter logic circuit; and wherein for the second AND logic circuit, the first AND input signal is the first input signal to the true and complement signal generating logic circuit after passing through the first and second inverter logic circuits and a third inverter logic circuit of the at least one inverter logic circuit, and wherein for the first and second AND logic circuits, the second AND input signal is the second input signal to the true and complement signal generating logic circuit, and the complement of the second AND input signal is the second input signal to the true and complement signal generating logic circuit after passing through a fourth inverter logic circuit of the at least one inverter logic circuit.

2. The true and complement signal generating logic circuit as in claim 1, wherein for each of the first and second AND logic circuits the three transistors include first and second NMOS transistors and one PMOS transistor.

3. The true and complement signal generating logic circuit as in claim 1, wherein for each of the first and second AND logic circuits first and second transistors of the three transistors form a transmission gate outputting one signal.

4. The true and complement signal generating circuit as in claim 3, wherein the first transistor is an NMOS transistor and the second transistor is a PMOS transistor.

5. The true and complement signal generating logic circuit as in claim 1, wherein for each of the first and second AND logic circuits a third transistor of the three transistors is a pull-down transistor.

6. The true and complement signal generating logic circuit as in claim 5, wherein the third transistor is an NMOS transistor.

7. The true and complement signal generating logic circuit as in claim 1, wherein for each of the AND logic circuits, when the second AND input signal has a logic HIGH level, the output signal of the AND logic circuit has a voltage approximately equal to a voltage level of an output signal of a transmission gate of the AND logic circuit.

8. The true and complement signal generating logic circuit as in claim 7, wherein a third transistor of the AND logic circuits is a pull-down transistor, and when the second AND input signal has a logic LOW level the output signal of the AND logic circuit has a voltage approximately equal to a drain of the third transistor, which pulls down the output signal from the transmission gate to a logic LOW level.

9. The true and complement signal generating logic circuit as in claim 1, wherein for each of the AND logic circuits, a delay is one of a delay of a transmission gate formed by first and second transistors of the three transistors, and a delay of a third transistor of the three transistors.

10. The true and complement signal generating logic circuit as in claim 1, wherein the complement of the second AND input signal is provided to a gate of a third transistor of the three transistors.

11. The true and complement signal generating logic circuit as in claim 1, wherein one of the first and second AND input signals of the true and complement signal generating logic circuit is a clock pulse signal.

12. The true and complement signal generating circuit as in claim 1, wherein the true signal and the complement signal outputted by the true and complement signal generating circuit are the outputs of the first and second AND logic circuits, respectively.

* * * * *